United States Patent
Takken et al.

(10) Patent No.: US 10,398,025 B2
(45) Date of Patent: Aug. 27, 2019

(54) PERIPHERAL END FACE ATTACHMENT OF EXPOSED COPPER LAYERS OF A FIRST PRINTED CIRCUIT BOARD TO THE SURFACE OF A SECOND PRINTED CIRCUIT BOARD BY SURFACE MOUNT ASSEMBLY

(71) Applicant: International Business Machines Corporation, Armonk, NY (US)

(72) Inventors: Todd E. Takken, Brewster, NY (US); Xin Zhang, Yorktown Heights, NY (US); Yuan Yao, Tarrytown, NY (US); Andrew Ferencz, Southborough, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/808,797

(22) Filed: Nov. 9, 2017

(65) Prior Publication Data
US 2019/0141830 A1    May 9, 2019

(51) Int. Cl.
*H05K 1/02* (2006.01)
*H05K 13/04* (2006.01)

(52) U.S. Cl.
CPC ........... *H05K 1/0298* (2013.01); *H05K 13/04* (2013.01)

(58) Field of Classification Search
CPC .. H05K 1/02; H05K 1/03; H05K 1/09; H05K 1/11; H05K 1/16; H05K 3/30; H05K 3/40;
(Continued)

(56) References Cited

U.S. PATENT DOCUMENTS 3,398,232 A * 8/1968 Hoffman ............... H01R 23/68
                                                  174/254
3,492,538 A   1/1970 Fergusson
(Continued)

OTHER PUBLICATIONS

Hermann et al., "Vertically Mounted Module", IP.com Prior Art Database Technical Disclosure, IPCOM000043327D, original publication date: Aug. 1, 1984, IP.com Electronic Publication Date: Feb. 4, 2005.
(Continued)

*Primary Examiner* — Xiaoliang Chen
(74) *Attorney, Agent, or Firm* — Scully, Scott, Murphy & Presser, P.C.; Daniel Morris, Esq.

(57) ABSTRACT

A printed circuit board (PCB) structure and mounting assembly for joining two PCBs. A first PCB has a top and bottom surface faces and a peripheral end face separating the top and bottom surface. The first PCB has one or more conductive wire ends exposed at a surface of the peripheral end face; the exposed conductive wire ends forming multiple separate electrical contacts across the thickness and length of the PEF surface. A second PCB has a top surface face and one or more conductive pads exposed at the top surface at locations corresponding to locations of the multiple electrical contacts. A surface mount solder material is disposed on one or more exposed conductive pads for electrically connecting with corresponding the multiple electrical contacts. The disposed solder material stably joins the PEF surface of the first PCB to the top surface of the second PCB in a relative perpendicular orientation.

12 Claims, 5 Drawing Sheets

(58) Field of Classification Search
CPC ... H01Q 1/24; H01Q 1/28; H01Q 1/50; H01R 12/00; H01R 23/00; H01R 23/12; H01R 23/68; G06K 7/10
USPC ....... 174/251, 250, 254, 255, 260–262, 264; 439/59, 65, 74, 79, 700; 343/702; 29/601, 830, 832, 834, 846
See application file for complete search history.

(56) References Cited

U.S. PATENT DOCUMENTS

| | | | |
|---|---|---|---|
| 3,530,422 A | | 9/1970 | Goodman |
| 5,136,471 A | * | 8/1992 | Inasaka ............... H01L 23/5385 174/255 |
| 5,471,368 A | | 11/1995 | Downie et al. |
| 5,545,924 A | * | 8/1996 | Contolatis ............... H01L 23/66 257/724 |
| 5,581,877 A | | 12/1996 | Woychik et al. |
| 5,668,409 A | | 9/1997 | Gaul |
| 6,111,205 A | * | 8/2000 | Leddige ............... H05K 1/0219 174/260 |
| 6,185,108 B1 | * | 2/2001 | Okura ................. H01H 13/702 174/377 |
| 6,235,551 B1 | | 5/2001 | Farnworth et al. |
| 6,246,016 B1 | | 6/2001 | Roessler et al. |
| 6,345,989 B1 | * | 2/2002 | Mason .................. H05K 3/366 439/65 |
| 6,554,654 B1 | * | 4/2003 | Stoddard ............ H01R 13/2471 439/59 |
| 6,710,266 B2 | | 3/2004 | Mix et al. |
| 6,784,372 B1 | | 8/2004 | Yuen et al. |
| 6,800,942 B1 | | 10/2004 | Kinsman |
| 6,815,614 B1 | | 11/2004 | Keating et al. |
| 6,930,893 B2 | | 8/2005 | Vinciarelli |
| 6,986,682 B1 | * | 1/2006 | Jeon ..................... H01R 13/658 439/607.07 |
| 7,180,397 B1 | | 2/2007 | Busletta et al. |
| 7,420,262 B2 | * | 9/2008 | Bauer ................... H01L 21/78 257/501 |
| 7,753,688 B1 | | 7/2010 | Everson et al. |
| 8,344,842 B1 | * | 1/2013 | Luzanov ............... H05K 1/141 336/192 |
| 8,572,841 B2 | * | 11/2013 | Pedersen ............... H05K 3/366 174/260 |
| 9,173,292 B1 | * | 10/2015 | Sokol ................... H05K 1/0219 |
| 9,468,103 B2 | * | 10/2016 | Isom ..................... H01Q 1/50 |
| 9,826,639 B2 | * | 11/2017 | Denda ................... H05K 1/113 |
| 2004/0190272 A1 | | 9/2004 | Takagi et al. |
| 2004/0207049 A1 | * | 10/2004 | Bauer ................... H01L 21/78 257/620 |
| 2006/0012048 A1 | * | 1/2006 | Murai ................. H01L 21/4857 257/758 |
| 2008/0015443 A1 | * | 1/2008 | Hosono ................. B06B 1/0611 600/459 |
| 2008/0066953 A1 | * | 3/2008 | Kanai ................... H05K 1/0218 174/260 |
| 2008/0083984 A1 | * | 4/2008 | Kagawa ............ H01L 23/49811 257/737 |
| 2009/0283299 A1 | * | 11/2009 | Suzuki ................. H05K 1/0207 174/251 |
| 2009/0322620 A1 | * | 12/2009 | Pedersen ............ H01Q 21/0087 343/702 |
| 2010/0307798 A1 | * | 12/2010 | Izadian .................. H01L 24/24 174/255 |
| 2013/0092428 A1 | * | 4/2013 | Kawaguchi .......... H05K 1/0218 174/262 |
| 2015/0282317 A1 | * | 10/2015 | Gonya .................. H05K 3/403 174/262 |
| 2016/0028926 A1 | * | 1/2016 | Ichimura ................ A61B 1/051 348/68 |
| 2016/0353572 A1 | * | 12/2016 | Lim ....................... H01L 23/12 |
| 2017/0256874 A1 | | 9/2017 | Abel et al. |

OTHER PUBLICATIONS

Anonymous, "Method to create a contact on the edge of a flip-chip IC package", IP.com Prior Art Database Technical Disclosure, IPCOM000020155D, IP.com Electronic Publication Date: Oct. 29, 2003.

Anonymous, "Disclosed is a method for a direct solder attachment of two or more printed circuit boards without a connector", IP.com Prior Art Database Technical Disclosure, IPCOM000006858D, IP.com Electronic Publication Date: Feb. 6, 2002.

Anonymous, "Method for the direct solder attachment of two or more printed circuit boards without a connector using top-side soldering", IP.com Prior Art Database Technical Disclosure, IPCOM000008067D, IP.com Electronic Publication Date: May 15, 2002.

List of IBM Patents or Patent Applications Treated As Related.

* cited by examiner

PERIPHERAL END FACE ATTACHMENT OF EXPOSED COPPER LAYERS OF A FIRST PRINTED CIRCUIT BOARD TO THE SURFACE OF A SECOND PRINTED CIRCUIT BOARD BY SURFACE MOUNT ASSEMBLY

STATEMENT REGARDING FEDERALLY SPONSORED RESEARCH OR DEVELOPMENT

This invention was made with Government support under Contract No.: B621073 awarded by Department of Energy. The Government has certain rights in this invention.

FIELD

The present invention generally relates to printed circuit boards for electrical/electronic devices and components, and methods of assembling and attaching printed circuit boards to each other.

BACKGROUND

Printed circuit boards (PCBs) are structures having a rigid, non-conductive substrate layer or a laminate of multiple substrate layers and carefully designed conductive pathways for routing electric/electronic signals and electric power to a circuit assembly that is typically mounted on the PCB surface. The circuit assembly may include various electrical and electronic components and one or more devices. The conductive pathways may be located along the surface of the substrate or may be embedded at layers within a multi-layer substrate. The easy movement of electronic signals and electric power helps the electronic devices to operate without interruption.

The embedded or surface located conductive pathways may be formed as copper foil, copper wires or copper sheets, however may comprise any conductive material.

A PCB typically includes pads on the top and/or bottom surfaces for use as contacts to other components or other printed circuit boards.

Traditionally pins are attached to contact pads on the top or bottom surface of the PCB. Vias then anchor the outer layer pads to internal layer metal structures to provide improved mechanical robustness and electrical conductivity.

Forming pads or contacts along the perimeter of the top or bottom Areal Main Faces (AMFs) of a PCB can limit the number and density of the contacts. In some cases, PCBs have a plated Peripheral End Face (PEF) to facilitate direct soldering to other circuit boards. However, when it is required to have one PCB mounted to another PCB, pins are commonly used in the circuit assembly.

The attaching of contact pins to the top or bottom surfaces of a PCB consumes area on many or all layers of the board. Existing methods of such peripheral end face attachment often use pins or connectors, which add cost and add electrical and thermal resistance.

SUMMARY

Attaching a peripheral end face (PEF) of one PCB to the face of a second PCB is a space efficient way to make electrical and thermal connections between the two PCBs.

There is provided printed circuit board structures and assembly for PCB structures.

In one aspect, a printed circuit board (PCB) structure includes: a laminate substrate having top and bottom areal main faces (AMFs), the laminate substrate having multiple layers of a non-conductive substrate material, the layers forming at least one peripheral end face (PEF) separating the top and bottom AMF. Conductive wiring at one or more of the multiple layers embedded within the substrate are adapted for carrying signals to first PCB surface mounted devices. The embedded conductive wiring at the multiple layers includes one or more conductive wire ends exposed at the PEF, the exposed conductive wire ends forming one or more separate electrical contacts across the thickness of the PEF and forming one continuous or multiple separate electrical contacts along a length of each conducting layer that is exposed at the PEF.

There is further provided a second printed circuit board (PCB) structure. The second PCB includes: a laminate substrate having a top and bottom AMF. There are one or more separate contact structures comprising conductive contacts or pads exposed at an AMF, each one or more exposed conductive pads at defined locations for providing electrical contact with corresponding one or more separate electrical contacts across the thickness of the PEF or one continuous or multiple separate electrical contacts along a length of each conducting layer that is exposed at the PEF of the first PCB. Each exposed conductive contact or pad connected to one or more layers of conductive wiring for carrying signals or thermal energy to other devices mounted on the top or bottom AMF of the second PCB. The one or more exposed conductive contacts or pads are adapted to mechanically and stably join with a respective separate electrical contact across the thickness of the PEF or one continuous or multiple separate electrical contacts along a length of each conducting layer that is exposed at the PEF of the first PCB using a conductive surface mount material disposed between a surface of the one or more exposed conductive contacts or pads at the defined locations and a the corresponding exposed respective separate electrical contact across the thickness of the PEF or one continuous or multiple separate electrical contacts along a length of each conducting layer that is exposed at the PEF.

In another aspect, there is provided a printed circuit board assembly. The assembly includes: a first printed circuit board (PCB) having a top and bottom areal main faces (AMF) and a peripheral end face (PEF) of predetermined width separating the top and bottom AMF and a second PCB having a top and bottom AMF. The first PCB has one or more conductive wire ends exposed at a surface of the peripheral end face; the exposed conductive wire ends forming one or more separate electrical contacts across the thickness of the PEF and forming one continuous or multiple separate electrical contacts along a length of each conducting layer that is exposed at the PEF of the first PCB, and the second PCB having one or more separate contact structures comprising conductive contacts or pads exposed at an AMF, each one or more exposed conductive contacts or pads at defined locations for providing electrical contact with a corresponding one or more separate electrical contacts across the thickness of the PEF or one continuous or multiple separate electrical contacts along a length of each conducting layer that is exposed at the PEF of the first PCB. A conductive surface mount material is disposed between the one or more exposed separate contact structures at the top AMF of the second PCB and corresponding respective separate electrical contact across the thickness of the PEF or one continuous or multiple separate electrical contacts along a length of each conducting layer that is exposed at the PEF of the first PCB, the disposed electrically conductive surface mount material stably joining the PEF of the first PCB to the top AMF of the second PCB in a perpendicular orientation relative to the second PCB.

DETAILED DESCRIPTION

Figure 5:
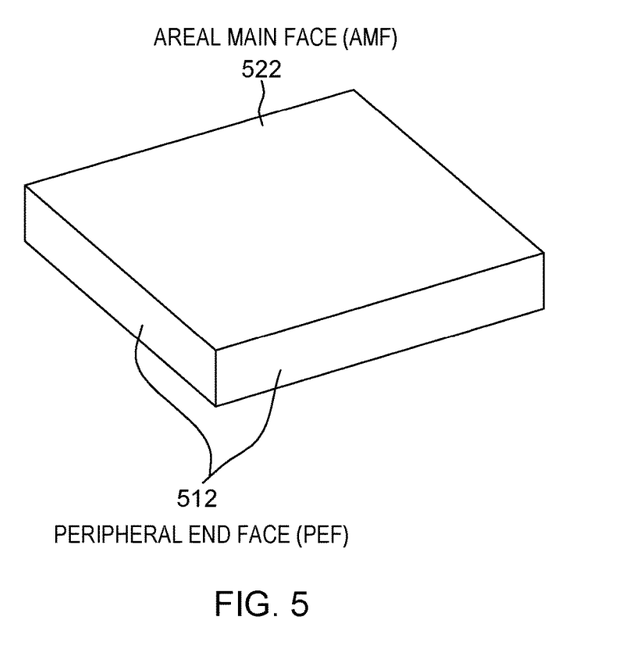
FIG. 5 relates to a printed circuit board structure having a peripheral end face (PEF) surface and areal main face surfaces.

As shown in FIG. 5, the embodiments described herein relate to a printed circuit board structure 500 having a peripheral end face (PEF) surface 512 and areal main face (AMF), e.g., top or bottom surfaces 522. In the embodiments described herein, the PEF of first PCB is of predetermined surface width separating top and bottom AMF surfaces of the first PCB with the two faces 522 having a larger area than the remaining four PEF faces.

There is also described a method of assembling a peripheral end face (PEF) of a first PCB for making electrical and thermal contact with an areal main face (AMF) top or bottom surface of a second PCB to form a surface mount assembly of PCBs. The first PCB includes one or more conductive wire ends exposed at a surface of the peripheral end face; the exposed conductive wire ends forming multiple separate electrical contacts across the thickness and length of the PEF surface of the first PCB. The second PCB has one or more conductive pads exposed at a top AMF thereof at locations corresponding to locations of the multiple separate electrical contacts. Electrically conductive surface mount material is disposed between the one or more exposed conductive pads at the top AMF surface of the second PCB and corresponding the multiple electrical contacts formed at the PEF surface of the first PCB. This disposed electrically conductive surface mount material stably joins the PEF surface of the first PCB to the top surface of the second PCB in a perpendicular orientation relative to the second PCB.

Figure 1:
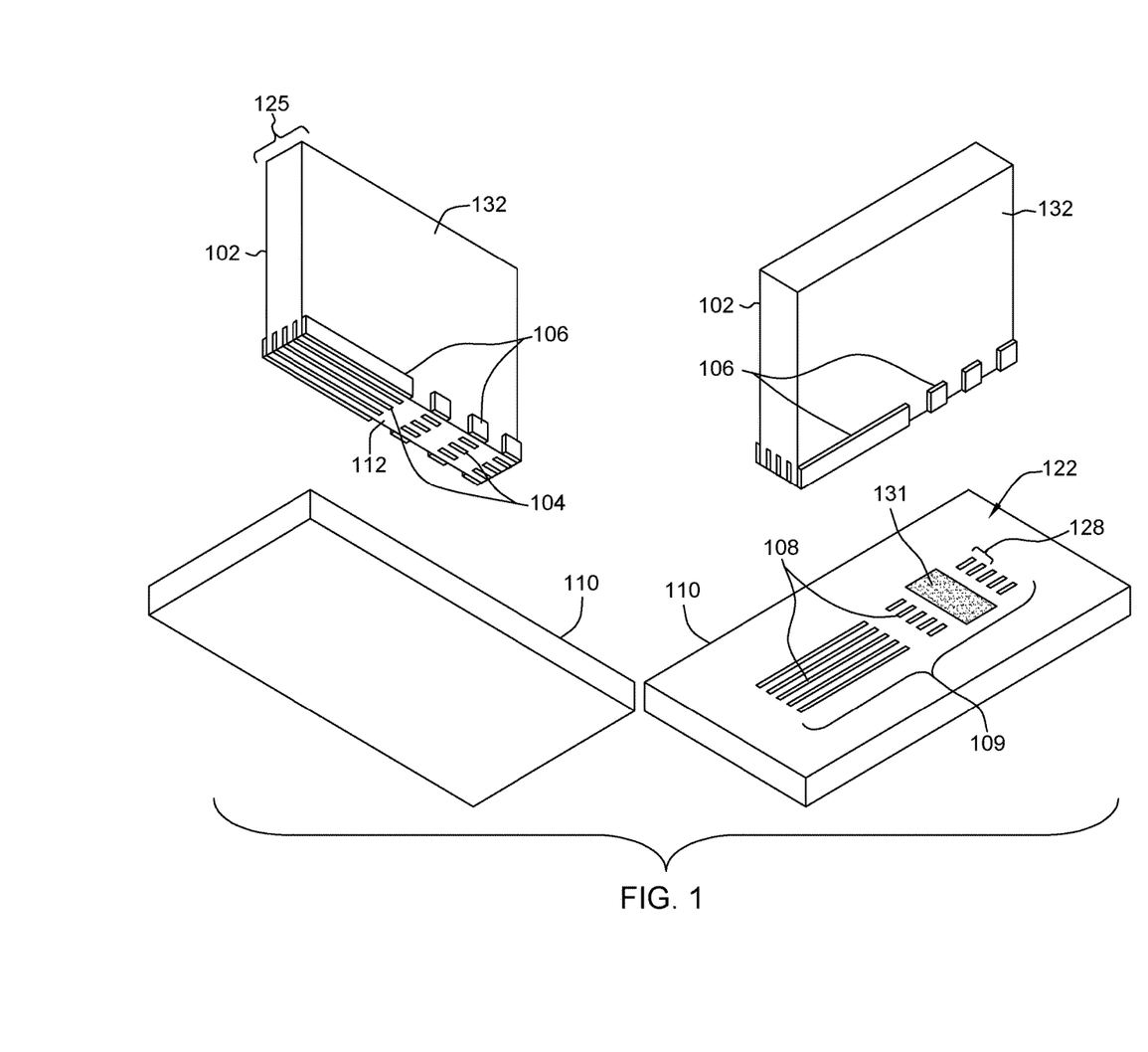
FIG. 1 are perspective views of an assembly for mounting a PEF of a first PCB board parallel to am AMF of a second PCB board, thereby mounting the first PCB orthogonal to the second PCB.

FIG. 1 shows a first perspective view of a surface mount assembly 100 for PCB boards in which a first PCB 102 of polygonal, e.g., square or rectangular geometry, having a bottom PEF 112 of the PCB 102 having multiple conductor connections is mounted to corresponding conductive features 109 on the AMF surface 122 of a second PCB board 110. The mating of the PEF 112 to a surface 122 of a second PCB provides for multiple contacts permitting conduction of electrical energy or heat from one PCB to the other.

In one embodiment, the PCB 102 may be a rigid printed circuit board having printed circuit materials including conductive pathways, e.g., layers of copper wires, for conducting electrical power or electronic signals to various electrical or mechanical devices. The PCB board may be rigid and formed as a laminate of one or more layers of printed circuit material substrates in which each substrate layer is an insulating dielectric material between exposed copper layers. Laminate types include multilayer, prepreg, cored, hollow cored. Multilayer laminate materials, may include, but are not limited to: one or more plys of glass, fiberglass, a plastic, Teflon, or a fabric or other insulating material having embedded conductive structures in a laminate structure. A common type of PCB substrate is FR-4, which is a fiberglass-epoxy laminate. A flexible PCB having a PEF with exposed conductive wires may be used in embodiments described herein.

The PCB 102 design includes an assembly of multiple conductive wires, e.g., copper, having ends 104 brought out to the PEF surface 112 such that they become exposed at a surface of the PEF 112. The PEF surface 112 includes exposed copper layers 104 adapted for direct mounting to a surface of a second printed circuit board assembly 110. In one embodiment, the thickness 125 of the PEF surface may range from between 0.02 inches and 0.20 inches although larger or smaller PCB thicknesses are contemplated commensurate with a designed aspect ratio. In one embodiment, a larger PEF surface thickness of up to 0.20 inches may include multiple layers, e.g., two, four, six, eight or ten or more dielectric layers each with a corresponding inner layer of conductor foil, e.g., of 0.5, 1.0 or 2.0 ounce of Copper or thicker. In one embodiment, a thickness of a conductive Copper layer may be 15 microns or thicker, e.g., multiples 10×-100× thereof, and defines an exposed PEF electrical contact thickness. In one embodiment, a conductor carrying electrical signals may be $\frac{1}{10}$ mm-1 mm thick for carrying larger current in the PCB 102, while electronic signals may be carried on thinner copper layers of reduced thickness, e.g., 0.1 mm. The conductive wire endings 104 that are exposed at the PEF surface are part of one or more electrical signal networks (nets) and/or electrical power nets for delivering power to electrical/electronic or mechanical devices that may be mounted at the surface of a first PCB 102. As shown, the nets and exposed conductive wiring lay in one or more layers of a first PCB, and hence form an assembly or pattern 109 of exposed conductor endings at the PEF surface. The conductive wire endings 104 that are exposed at the PEF surface may provide a thermal contact for carrying thermal energy away from electrical/electronic or mechanical devices that may be mounted at the surface of a first PCB 102.

The pattern or assembly 109 of second PCB includes multiple conductive wire connectors corresponding to the conductive Copper wire layers within the first PCB across the peripheral thickness of the PEF and having wire ends terminating at the surface of the PEF. The pattern 109 provides an increased density of connections compared to surface mounted connections. The resolution would be limited to thicknesses of the dielectric layers and copper wiring of the first PCB 102. Some of the conductive wiring between dielectric layers may be electrically isolated, i.e., belong to different electrical nets in the PCB. They may be part of the same electrical net. They may carry electrical power to surface mount devices or they may carry electronic signals to various devices.

As further shown in FIG. 1, PCB 102 further includes plated copper layers 106 of like thickness as layers 104 and situated at lower peripheral portions on the external (e.g., front or back) AMF surface 132 of the PCB 102. These plated copper layers may be electrically connected with one or more electrical or power nets of the PCB 102 and may connect with exposed connections 104. The exposed connections 104. and plated copper layers 106 and laminate PEF surface 132 may have a lower edge that are coplanar with each other along a PEF surface.

The PEF surface 112 of the PCB 102 s adapted for mounting to a second PCB by a surface mounting solder assembly such that the exposed electrical connections 104 and plated copper layers 106 along the PEF surface 112 are mounted for electrically connection to corresponding electrical contact pads 108 located on the surface of the second PCB 110. In one embodiment, the PCB 102 may be mounted in an orientation perpendicular to the plane surface of the second PCB 110.

In one embodiment, the second PCB 110 as shown in a second perspective view of FIG. 1B may be a mother board and carry electrical signals to other devices via electrical signals and power nets within the PCB 110. Thus, in one embodiment, the resolution and density of the surface electrical contact copper layers 104 and plates 106 on the PEF surface of first PCB 102 to be mounted to the second PCB 110 is limited to the thickness resolution, density and pitch of corresponding electrical pad contacts 108 on the surface of the second PCB 110, and how small a contact pad 108 may be defined as shown in a second perspective view of FIG. 1B. In an example implementation, a corresponding electrical pad contact 108 thickness may be 1/10 mm thick, and the pitch distance 128 between adjacent electrical pad contacts 108 on the surface of the second PCB 110 may be ½ mm to 1 mm pitch, but smaller or larger distances are contemplated. For example, a pitch distance 128 between adjacent electrical pad contacts 108 on surface 122 may be 500 microns-1000 microns, however, a pitch distance may be 15 microns or less depending upon the minimum space achievable using a PCB pad or contact manufacturing process.

In embodiments, the electrical/thermal contact structures 108 on the surface of the second PCB 110 may be individually connected to a corresponding conductive wire end connection 104 and peripheral plates 106 of PCB 102 via an individual solder connection deposited between a surface of the electrical/thermal contact structure (an electrical and/or thermal contact or pad) 108 of the second PCB 110 and the corresponding electrical/thermal contact 104, 106 of the first PCB 102. The custom spacing of the exposed contacts and pads in conjunction with the solder paste volume requirements needed to attach the PEF of the first PCB with an exposed copper contact of the second PCB is carefully designed to ensure proper electrical/thermal connection. For example, the pitch and size of the exposed contacts or pads on the AMF of the second PCB must exactly match the pitch and size of the one or more separate electrical contacts across the thickness of the PEF of the first PCB being mated and the one continuous or multiple separate electrical contacts along a length of each conducting layer that is exposed at the PEF of the first PCB. The 2-D dimension of the PEF 112 of the first PCB is designed proportionate to an overall size of the first PCB such that the individual solder connections deposited between a surface of the electrical contact 108 of the second PCB 110 and the corresponding electrical/thermal contact 104, 106 of the first PCB 102 provide a mechanically stable base for surface mounting of the first PCB to the AMF of the second PCB 110. That is, the first PCB is designed having an aspect ratio and a chosen 2-D dimensional PEF 112 of a thickness sufficient to ensure mechanical stability when the PEF of the first PCB 102 is surface mount soldered in a perpendicular orientation to the AMF surface of the second PCB 110.

In alternative embodiments, a larger electrical/thermal contact structure 131 may be created at the surface of the second PCB 110 to connect to several electrical/thermal contacts 104, 106 at the PEF surface 112 of the first PCB 102 for providing an increased current carrying capacity such as for transferring power signals.

Figure 2:
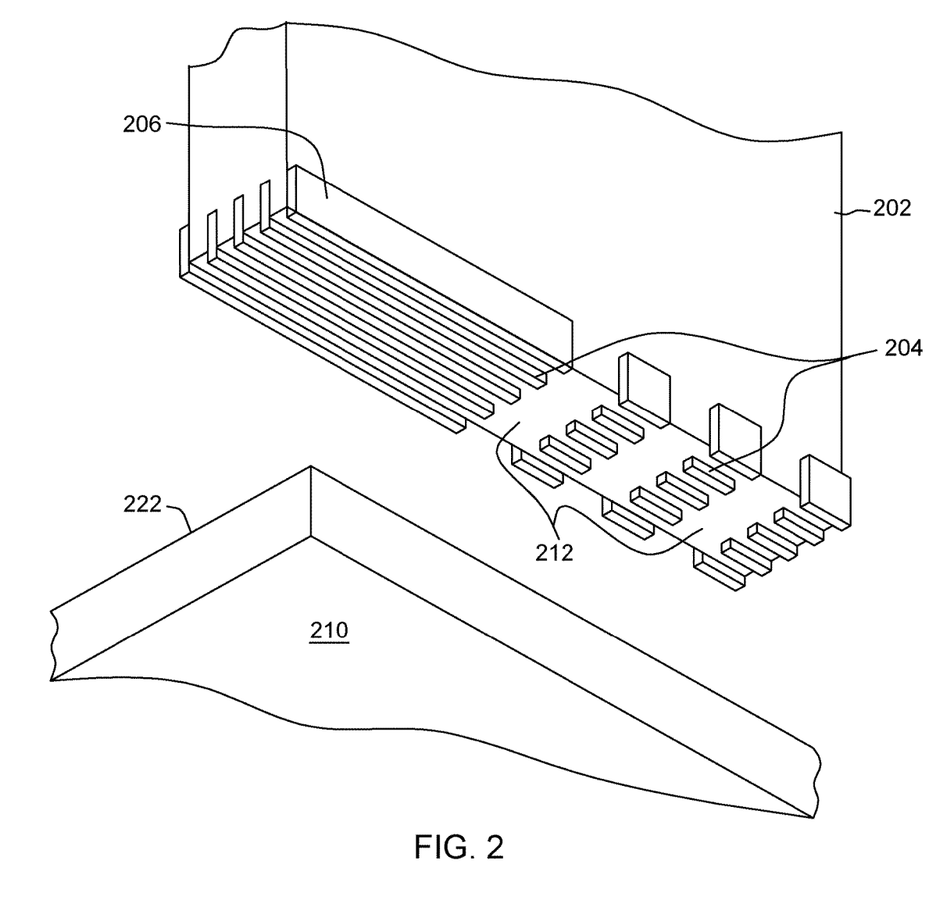
FIG. 2 depicts a close-up view of an embodiment of the PEF of a first laminate PCB in which each substrate layer surface of insulating dielectric material is recessed between exposed copper layers and peripheral contact pads.

FIG. 2 depicts a close-up view of a PEF 212 of a first laminate PCB 202 in which each substrate layer of insulating dielectric material is recessed between exposed copper layer ends 204 and peripheral conductive pads 206 of the first PCB 202. In one embodiment, only the laminate dielectric material of PEF 212 is etched back from the surface so that the laminate is recessed relative to a bottom of the exposed copper wire ends 204 at one or more layers of the PCB and bottom of peripheral conductive pads 206. In one embodiment, using known techniques, a wet or dry etch may be used to etch back the laminate materials(s) at the PEF surface. For example, etchants such as strong acids (nitric, sulfuric or combinations) alkalis, organic solvents, or plasma, or reactive-ion etching techniques, may be used to remove laminate dielectric material from the PEF surface selective to the conductive material, e.g., copper or aluminum. In one embodiment, the laminate material portion of the surface may be recessed for a distance on the order of magnitude of the thickness of the conductive copper wire ends 204 and thickness peripheral conductive pad 206 in the cross-section of PEF surface 212 of PCB 202, e.g., 15 microns-100 microns, or similar order of magnitude.

When assembling the PCB 102 to join the surface 222 of PCB 210, the PEF 212 with recessed laminate material enables an increased amount of solder to be located for connecting the exposed conductive endings 204 and pads 206 with corresponding conductive pads 108 on the surface 112 of the second PCB. The recessing of the surface 212 provides additional space and volume between the recessed surface of the PEF of first PCB and second PCB planar surface 112 thereby enabling a larger volume of solder paste to make contact with the exposed contacts 204, 206 and allowing the solder to wick up around the edges of the exposed contacts resulting in increased adhesion, and better mechanical, electrical and thermal contact between the exposed contacts on the PEF of the first PCB and the corresponding pad on the face of the second PCB.

In one embodiment, any exposed portion of the exposed copper layers on the PCB PEFs may be protected from oxidation by using a same surface finish used to protect traditional vias, pads and exposed top and bottom surface copper features. Such surface finishes may include an organic surface protectant such as an Organic Solderability Preservative (OSP), or a hot air surface leveling (HASL) which may be applied to any exposed wire surfaces to protect the exposed wire edges prior to a mating assembly.

Figure 3:
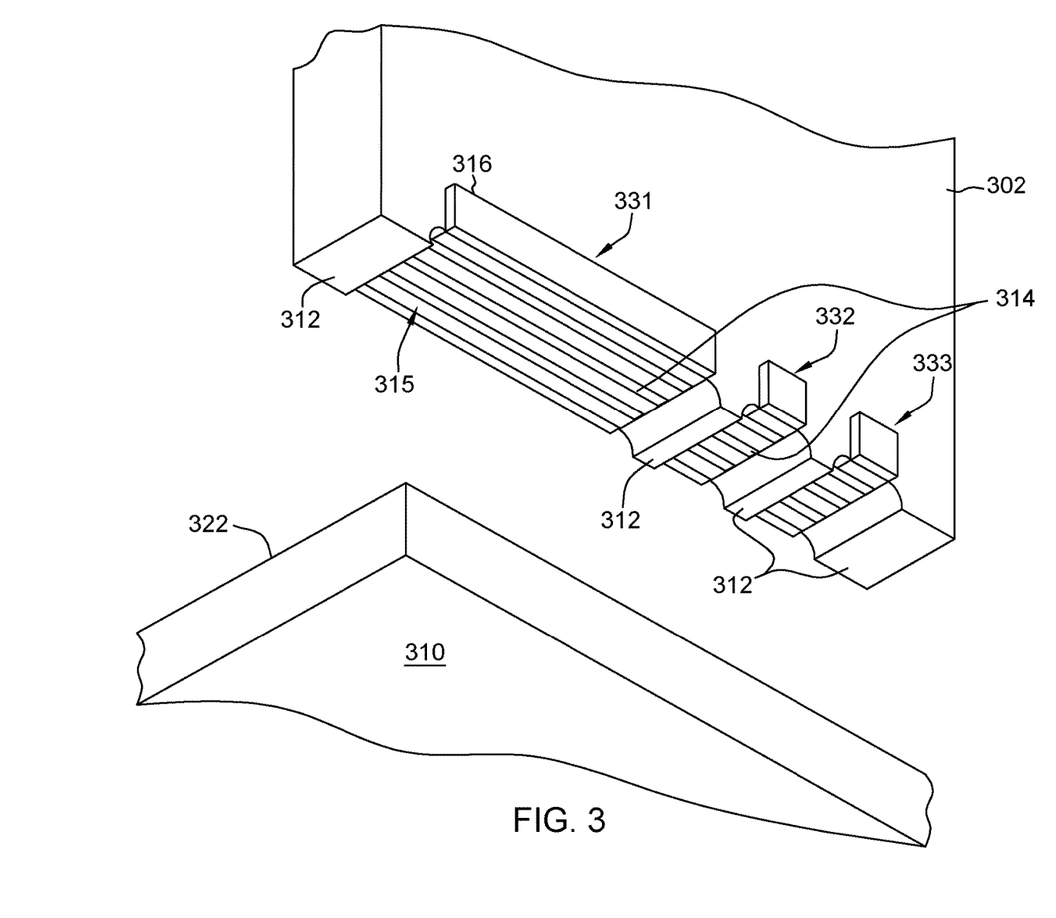
FIG. 3 depicts a close-up view of a further embodiment in which the bottom PEF surface of the first PCB is "routed back" at one or more selected regions.

FIG. 3 depicts further embodiment in which the bottom PEF 312 of a first PCB 302 is "routed back" at one or more selected regions such that edge portion(s) of the PCB 302 including the laminate dielectric PCB material layers, exposed conductive wires endings 314 and pad endings 316 at those regions are effectively cut and removed. The cut portions thus define a second PEF surface 315 that is recessed relative to a PEF laminate area bottom surface portions 312 without electrical contacts. Each cut edge portion thus defines one or more recessed contact regions, e.g., contact regions 331, 332 and 333 in a non-limiting embodiment. There is no limitation as to the number of contact regions or length of the regions that may be formed. Each resulting recessed contact region formed has exposed copper layer contact ends 314 and peripheral conductive contact pad 316 pad at the second PEF surface 315. In the embodiment, depicted in FIG. 3, when assembling first PCB 302 with second PCB 310 by surface mounting, the recessed contact region creates an additional space and a larger volume permits for an increased amount of solder paste.

In one embodiment, a mechanical route back technique using a drill machine having a router bit may be used to route back both the laminate material layers and conductive wire 314 and peripheral contact pad 316 exposed at one or more selected regions, e.g., PEF regions 331, 332, 333. In one embodiment, the route back distance may be on the order of a ½ mm-1 mm, but larger or smaller route back distances are contemplated. This may result in better mechanical, electrical and thermal contact between the exposed contacts 314 on the PEF of the first PCB and the corresponding mating pad 108 on the surface 322 of the second PCB 310. This feature may be beneficial to account for any topological or non-coplanarity or surface flatness inconsistencies between the mating PEF surface 312 and the surface 322 of the second PCB 310 when assembled. However, while the increased space may permit additional solder material to make contact with exposed copper 314, 316, this may reduce the ability to have all contacts within any cross-section of a contact region to be electrically separate. In one embodiment, all the contacts 314 and 316 in any one region 331, 332 and 333 may be shorted by conductive solder when mated to the surface of second PCB surface 322.

In an embodiment, the recessed distance of FIG. 2 is at a reduced depth compared to the route back distance in the embodiment of FIG. 3. In one embodiment, the route back is done in cases when all exposed conductive wires are to be shorted together and a larger distance facilitates this, e.g., on the order of tenths to ½ mm as limited by the property of the liquid solder (e.g., an aspect ratio) that is disposed in the routed back sections to short the exposed conductive wires. In one embodiment, a recessed depth amount and route back distance can be proportional to but smaller than the smallest dimension of the contacts or pads formed on the AMF 122 of the second PCB.

Figure 4:
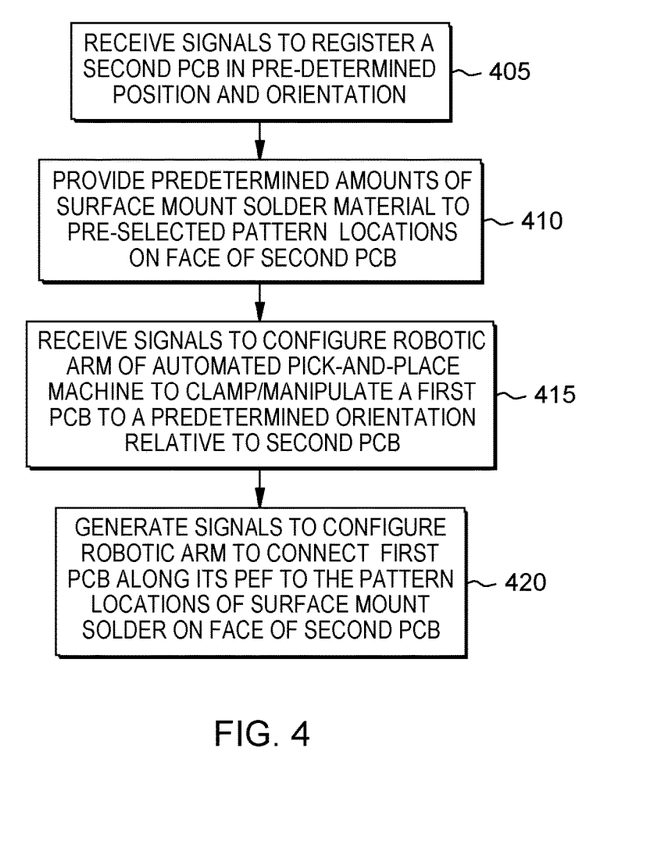
FIG. 4 depicts a method for surface mount assembling of two PCBs with the mounted PCB being one of the embodiments shown in FIG. 1, 2 or 3.

FIG. 4 depicts a method 400 for surface mount assembling two PCBs. The surface mount assembling includes mating a first printed circuit board (PCB), e.g., a PCB 102, 202 or 302 (of respective FIGS. 1, 2 and 3) along a respective peripheral end face surface 112, 212 or 312, in a vertical orientation relative to lateral positioned second PCB, e.g., second PCBs 110, 210 and 310, respectively.

In one embodiment, at 405, a device registration or conveyor system may be programmed with control signals for registering or aligning the second PCB, e.g., PCB 110, 210 and 310, at a predetermined registration location or position to facilitate placement of the first PCB on an AMF thereon. For example, a conveyor belt (not shown) may carry the second PCB which may be clamped or retained in a predetermined position or orientation.

In one embodiment, at 410, there are then deposited predetermined amounts of surface mount solder material to pre-selected locations of a pattern of electrical and/or thermal contacts formed on the AMF face of the second PCB. For example, a system may be invoked to provide a flow of a conductive surface mount material, e.g., a solder material, a solder paste, a solder flux or combinations of the solder material, solder paste, or solder flux, on the top surface of the second PCB using conventional surface mount placement techniques. In one embodiment, a high-resolution solder mounting assembly device may employ a robot to deposit a predetermined amount of solder material individually to one or more respective electrical and/or thermal contact pads 108 on AMF surface of second PCB, e.g., surfaces 122, 222, 322. In other embodiments, any area of pattern 109 that does not need to be soldered may be first covered with a solder resist (solder mask). The solder material is retained at the surfaces corresponding to each of the one or more exposed conductive pads at defined locations of the pattern 109. In one embodiment, a wet solder paste material may be squeegeed on top of the surface of a solder mask, or the solder paste may be applied spread out to cover multiple conductive exposed circuit pads 108 for shorting several electrical contacts together. Shorting together multiple electrical or thermal contact pads 108 using solder paste flow may be used to define a larger electrical contact pad on the AMF surface of second PCB.

In one embodiment, at 415, FIG. 4, a mechanical robot arm of an automated pick-and-place machine or surface-mount technology machine may then be programmed to carry out specific programmed steps to create a PCB assembly, i.e., to precisely pick up and precisely orient and place the first PCB along its PEF wall 112, 212, 312 onto the second PCB surface, e.g., a surface 122, 222, 322, at the corresponding pattern 109. This automated pick-and-place machine may receive signals to configure robotic arm of automated pick-and-place machine to clamp/manipulate a first PCB to a predetermined orientation relative to second PCB, e.g., using pneumatic suction devices, e.g., cups or fingers with a vacuum chuck (not shown), to allow the cup(s) or fingers to be accurately manipulated in three dimensions.

At 420, with the second PCB retained in a precise location, the robotic arm may receive signals for manipulating the first PCB 102 such as rotate it to a correct perpendicular orientation relative to the second PCB, and then place it on the appropriate pattern 109 of electrical contact pads having suitably placed surface mount solder material at the locations of one or more selected contacts on the areal surface of the second PCB with high precision.

Although not shown, the automated pick-and-place machine may employ a visual or optical tracking system on the robot arm such that the suction cup or vacuum fingers may adjust the alignment position of first PCB relative to the correct placement location on the surface of the second PCB 110. A special camera system may take any measurements and make any adjustments necessary to align the first and second PCB before placement. For example, a camera on the pick-and-place robotic arm may photographs the PCB surface to measure its position on the conveyor belt accurately prior to placement.

The mating assembly registers the second PCB and the robotic am orients the first PCB so that the PEF surface is oriented perpendicular to the top surface of the second PCB. Optical tracking means may be implemented to ensure correct orientation so that the separate electrical contacts at the PEF surface of the first PCB is aligned with corresponding exposed surface contact pads of the second PCB. Then, at 420, the robotic arm then lowers the first PCB so that each of the one or more exposed conductive pads 108 having surface mounting solder at the defined locations are electrically connected with corresponding electrical contacts/pads 104, 106, 204, 206, 314, 316 exposed on the peripheral end face (PEF) surface of the respective joined first PCBs (e.g., 102, 202 or 302).

The electrically conductive surface mount solder material disposed between the one or more exposed conductive pads at the top surface of the second PCB and corresponding the multiple electrical contacts formed at the PEF surface of the first PCB stably joins the PEF surface of the first PCB to the top surface of the second PCB in a perpendicular orientation relative to the second PCB.

The PEF surface of a PCB with exposed copper layers on a first PCB attach to contacts on the face of a second PCB by surface mount assembly has several advantages, the least of which are: 1) a lower cost plus lower thermal and electrical resistances when conducting electrical signals thermal energy between the two PCB boards; 2), by making contact to the PEF of the first PCB, there is consumed less PCB area on the first PCB; 3) no process step is required to form pads or plated contacts on the PEF of the PCB. Elimination of this step has the additional functional advantage of allowing separate electrical PEF contact across the thickness of the circuit board; and 4) avoids having to plate or route at different heights from the PEF in regions with and without contacts. This allows squeezing contacts more densely along the length of the PEF.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A printed circuit board (PCB) comprising:
    a laminate substrate having a top and a bottom areal main face (AMF), the laminate substrate having multiple layers of a non-conductive substrate material, the layers forming at least one peripheral end face (PEF) surface separating the top and bottom AMF;
    conductive wiring at one or more of the multiple layers embedded within the substrate, the conductive wiring adapted for carrying signals to first PCB surface mounted devices;
    the PEF surface including one or more recessed sections, wherein at each recessed section, the embedded conductive wiring at the multiple layers includes one or more conductive wire ends exposed at and coplanar with the PEF surface, the exposed conductive wire ends forming one or more separate electrical contacts across the thickness of the PEF and forming one or more continuous or multiple separate electrical contacts along a length of each conducting layer that is exposed at the PEF surface at the recessed section, the PCB adapted to be directly mounted along its PEF surface at the recessed section to an AMF surface of a second printed circuit board (second PCB) using a surface mount solder material, the one or more continuous or multiple separate electrical contacts making direct electrical and/or thermal contact to corresponding mating conducting areas on the AMF of the second PCB via the surface mount solder material.

2. The printed circuit board of claim 1, wherein the one or more conductive wire ends exposed at the PEF are located on a top outer areal main face (AMF), on a bottom outer AMF, on one or more internal conducting layers, or on any combination of such internal and external conducting layers.

3. The printed circuit board of claim 2, wherein the one or more conductive wire ends have exposed peripheral end surfaces which are coplanar with a surface of the PEF of multiple laminate substrate material layers and which together form a planar peripheral end face (PEF) of the PCB from which the conductive wire ends are neither recessed nor protrude.

4. The printed circuit board of claim 2, wherein the laminate substrate material at the PEF corresponding to each of the multiple internal and/or external layers is recessed internally away from the plane of the PEF relative to an exposed end of the one or more exposed conductive wire ends.

5. The printed circuit board of claim 2, wherein the exposed one or more conductive wire ends, a bottom end of a peripheral conductive pad, and the surface of the recessed laminate substrate material are substantially coplanar at the one or more recessed sections of said PEF surface.

6. The printed circuit board of claim 5, wherein a portion of the PEF surface is disposed between the one or more recessed sections.

7. The printed circuit board as claimed in claim 2, wherein the one or more conductive wire ends exposed at the PEF conduct one or more of electrical signals and/or thermal energy to or from devices mounted on the top or bottom AMF.

8. The printed circuit board as claimed in claim 7, wherein the one or more conductive wire ends exposed at the PEF for conducting electrical signals belong to one or more isolated electrical networks of the PCB.

9. The printed circuit board as claimed in claim 1, wherein the first PCB is of an aspect ratio and the PEF defines a 2-D dimensional surface of a thickness sufficient to ensure mechanical stability when the PEF of the first PCB is surface mount soldered to the AMF surface of the second PCB.

10. The printed circuit board as claimed in claim 1, wherein the second PCB comprises:
    a laminate substrate having top and bottom AMF;
    said one or more separate contact structures comprising conductive contacts or pads exposed at an AMF, each one or more exposed conductive pads at defined locations for providing electrical contact with corresponding one or more separate electrical contacts across the thickness of the PEF or one continuous or multiple separate electrical contacts along a length of each conducting layer that is exposed at the PEF of the first PCB, each exposed conductive contact or pad connected to one or more layers of conductive wiring for carrying signals or thermal energy to other devices mounted on the top or bottom AMF of said second PCB,
    the one or more exposed conductive contacts or pads adapted to mechanically and stably join with a respective separate electrical contact across the thickness of the PEF or one continuous or multiple separate electrical contacts along a length of each conducting layer that is exposed at the PEF of the first PCB using a conductive surface mount material disposed between a surface of the one or more exposed conductive contacts or pads at the defined locations and a the corresponding exposed respective separate electrical contact across the thickness of the PEF or one continuous or multiple separate electrical contacts along a length of each conducting layer that is exposed at the PEF.

11. The printed circuit board of claim 10, wherein the conductive surface mount material is a solder material, a solder paste, solder flux or combinations of the solder material, solder paste, or solder flux.

12. The printed circuit board of claim 10, wherein the joined second PCB's AMF is oriented perpendicular relative to the AMF of the first PCB.

\* \* \* \* \*